US007553092B2

(12) United States Patent
Choi et al.

(10) Patent No.: US 7,553,092 B2
(45) Date of Patent: Jun. 30, 2009

(54) OPTICAL MODULE AND OPTICAL MODULE PACKAGE

(75) Inventors: Kwang Seong Choi, Seoul (KR); Yong Duck Chung, Daejeon (KR); Young Shik Kang, Daejeon (KR); Dong Suk Jun, Daejeon (KR); Je Ha Kim, Daejeon (KR); Jong Tae Moon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 23 days.

(21) Appl. No.: 11/450,743

(22) Filed: Jun. 8, 2006

(65) Prior Publication Data

US 2007/0047878 A1    Mar. 1, 2007

(30) Foreign Application Priority Data

Aug. 26, 2005    (KR) .................... 10-2005-0078708

(51) Int. Cl.
*G02B 6/36*    (2006.01)

(52) U.S. Cl. .......................... 385/92; 505/210

(58) Field of Classification Search .............. 333/22, 333/32, 324, 343, 822, 852, 131, 134, 124, 333/34, 216–217, 138, 202–212, 24 C, 245–263; 257/343; 379/394, 398; 343/394, 860–864, 343/852; 326/21–33; 385/1, 2, 8, 14, 37, 385/129, 147
See application file for complete search history.

(56) References Cited

U.S. PATENT DOCUMENTS 3,513,403 A * 5/1970 Chang .................... 330/4.9

(Continued)

FOREIGN PATENT DOCUMENTS

JP    09326602 A * 12/1997

(Continued)

OTHER PUBLICATIONS

"Ultra Wide-Band Electroabsorption Modulator Modules for DC to Millimeter-Wave Band", N. Mineo, et al., 2001 IEEE, pp. 9-12.

(Continued)

*Primary Examiner*—Frank G Font
*Assistant Examiner*—Peter Radkowski
(74) *Attorney, Agent, or Firm*—Blakely, Sokoloff, Taylor & Zafman LLP

(57) ABSTRACT

Provided is an optical module used in a communication system employing a radio over fiber (ROF) technology delivering a radio frequency (RF) signal through an optical fiber. The optical module includes: an optical device; a signal line for transporting a radio frequency (RF) signal input from an external circuit to the optical device; and a resistor separately disposed from the signal line and having one end connected with the optical device, wherein the input impedance seen from the signal line is matched by the resistor. A bias voltage supplied to operate the optical device is applied through an inductor connected to the signal line between the optical device and a filter. Here, the filter formed by a pattern of the signal line prevents the bias voltage from being supplied to the external circuit. In order to amplify the RF signal input from the external circuit, an amplifier may be connected between the external circuit and the filter.

17 Claims, 4 Drawing Sheets

U.S. PATENT DOCUMENTS

| | | | | |
|---|---|---|---|---|
| 4,311,966 A * | 1/1982 | Bert et al. | 330/286 |
| 4,331,940 A * | 5/1982 | Uwano | 331/99 |
| 4,491,976 A * | 1/1985 | Saitoh et al. | 455/315 |
| 4,609,892 A * | 9/1986 | Higgins, Jr. | 333/204 |
| 4,681,449 A * | 7/1987 | Bloom et al. | 356/364 |
| 4,706,049 A * | 11/1987 | Dydyk | 333/110 |
| H000432 H * | 2/1988 | Mariani et al. | 333/205 |
| 4,802,178 A * | 1/1989 | Ury | 372/36 |
| 4,906,947 A * | 3/1990 | Hart et al. | 331/107 SL |
| 5,017,895 A * | 5/1991 | Buck et al. | 333/134 |
| 5,024,966 A * | 6/1991 | Dietrich et al. | 438/23 |
| 5,278,529 A * | 1/1994 | Willems | 333/204 |
| 5,412,339 A * | 5/1995 | Takano | 330/54 |
| 5,426,402 A * | 6/1995 | Mariani | 333/205 |
| 5,448,211 A * | 9/1995 | Mariani | 333/205 |
| 5,526,172 A * | 6/1996 | Kanack | 359/291 |
| 5,548,255 A * | 8/1996 | Spielman | 333/132 |
| 5,600,740 A * | 2/1997 | Asfar | 385/27 |
| 5,903,820 A * | 5/1999 | Hagstrom | 455/82 |
| 6,023,206 A * | 2/2000 | Henderson et al. | 333/204 |
| 6,101,295 A * | 8/2000 | Mineo et al. | 385/1 |
| 6,178,311 B1 * | 1/2001 | Pance et al. | 455/78 |
| 6,236,279 B1 * | 5/2001 | Fujii et al. | 331/68 |
| 6,529,750 B1 * | 3/2003 | Zhang et al. | 505/210 |
| 6,556,102 B1 * | 4/2003 | Sengupta et al. | 333/161 |
| 6,607,934 B2 * | 8/2003 | Chang et al. | 438/50 |
| 6,677,830 B2 * | 1/2004 | Miller, Jr. et al. | 333/33 |
| 6,690,176 B2 * | 2/2004 | Toncich | 324/629 |
| 6,717,491 B2 * | 4/2004 | Liang et al. | 333/205 |
| 6,806,724 B2 * | 10/2004 | Hayden et al. | 324/754 |
| 6,927,644 B2 * | 8/2005 | Toncich | 333/24 C |
| 7,142,884 B2 * | 11/2006 | Hagn | 455/552.1 |
| 7,180,394 B2 * | 2/2007 | Ammar et al. | 333/247 |
| 7,298,933 B2 * | 11/2007 | Choi et al. | 385/1 |
| 7,342,470 B2 * | 3/2008 | Bassali | 333/219 |
| 2002/0063600 A1 * | 5/2002 | Dohata | 330/286 |
| 2002/0098611 A1 * | 7/2002 | Chang et al. | 438/50 |
| 2002/0149443 A1 * | 10/2002 | Toncich et al. | 333/158 |
| 2002/0149448 A1 * | 10/2002 | Toncich | 333/205 |
| 2002/0154001 A1 * | 10/2002 | Tan et al. | 340/310.05 |
| 2003/0222732 A1 * | 12/2003 | Matthaei | 333/99 S |
| 2004/0178867 A1 * | 9/2004 | Rahman et al. | 333/205 |
| 2004/0183627 A1 * | 9/2004 | Lo Hine Tong et al. | 333/212 |
| 2004/0239452 A1 * | 12/2004 | Bassali | 333/202 |
| 2004/0247220 A1 * | 12/2004 | Bosso et al. | 385/2 |
| 2004/0253003 A1 * | 12/2004 | Farmer et al. | 398/214 |
| 2005/0002677 A1 * | 1/2005 | McAllister et al. | 398/197 |
| 2005/0024166 A1 * | 2/2005 | Ammar et al. | 333/247 |
| 2005/0047454 A1 * | 3/2005 | Williamson | 372/26 |
| 2005/0047780 A1 * | 3/2005 | Hoshida et al. | 398/33 |
| 2005/0156683 A1 * | 7/2005 | Rohde et al. | 331/185 |
| 2005/0280478 A1 * | 12/2005 | Patel et al. | 331/107 SL |
| 2006/0164189 A1 * | 7/2006 | Tohya et al. | 333/238 |
| 2007/0030100 A1 * | 2/2007 | Rahman et al. | 333/205 |
| 2007/0085108 A1 * | 4/2007 | White et al. | 257/173 |
| 2007/0116472 A1 * | 5/2007 | Kim et al. | 398/135 |

FOREIGN PATENT DOCUMENTS

| | | | |
|---|---|---|---|
| JP | 2000138503 A | * | 5/2000 |
| KR | 1020020056182 | | 7/2002 |
| WO | WO 90/13943 | * | 11/1990 |
| WO | WO 9013943 A1 | * | 11/1990 |

OTHER PUBLICATIONS

Impedance Matching Approach to 60 GHz Band Analog Traveling Wave Electro-Abosrption Modulator (TWEAM) Module, K. Choi, et al., Basic Research Laboratory, ETR1, pp. 1-4.

* cited by examiner

OPTICAL MODULE AND OPTICAL MODULE PACKAGE

CROSS-REFERENCE TO RELATED APPLICATION

This application claims priority to and the benefit of Korean Patent Application No. 2005-78708, filed on Aug. 26, 2005, the disclosure of which is incorporated herein by reference in its entirety.

BACKGROUND

1. Field of the Invention

The present invention relates to an optical module used in a wireless communication system, and more particularly, to an optical module allowing a radio frequency (RF) signal inputted from an external circuit to be delivered to an optical device without any loss in a communication system that employs radio over fiber (ROF) technology delivering an RF signal through an optical fiber.

2. Discussion of Related Art

Recently, as the use of wireless communication such as Internet traffic rapidly increases, various technologies have been developed to wirelessly transmit a wideband signal to a subscriber. For wireless communication between a base station and the subscriber, information should be transported from a central office to the base station without any loss.

In a conventional communication system delivering an RF signal through a line such as a copper line or a coaxial cable, a large number of problems are generated by loss in the line. To solve these problems, ROF technology was developed. Radio-over-Fiber (ROF) link technology employs optical carriers that are intensity modulated by the microwave signals through optical modulators and transmitted or distributed to optical receivers via optical fibers. It takes advantages of excellent characteristics of single mode fiber such as low optical attenuation (0.2 dB/km), wide data bandwidth, and no electromagnetic interference (EMI). According to the ROF technology, an optical module is required to deliver the RF signal to the optical fiber. FIG. 1 is a plan view of a conventional optical module, and FIG. 2 is a cross-sectional view taken along line A1-A2 of FIG. 1.

Referring to FIGS. 1 and 2, an optical device 13 is mounted on a substrate 10 that serves as a ground, and a signal line 12 for delivering an RF signal input from an external circuit 20 to the optical device 13 is formed adjacent to the optical device 13. The signal line 12 is electrically insulated from the substrate 10 by a dielectric 11, and connected with the optical device 13 by a wire or ribbon wire 14.

The signal line 12 is made of a microstrip line, and two open stubs 15 are formed perpendicular to the signal line 12 for impedance matching between the optical device 13 and the external circuit 20.

In order to match the impedance between the external circuit 20 and the optical device 13, the open stubs 15 should be trimmed using a laser while return loss is measured on the signal line 12 in the optical module formed as described above. Specifically, even though the optical module is designed to match the impedance between the external circuit and the optical device, the impedance is probably not matched due to variation in device characteristics, tolerance of the packaging process, and so forth. Hence, at least one of the open stubs 15 should be trimmed in a width or length direction until the impedance is matched. Therefore, after the optical module is fabricated, an additional process is required for impedance matching. In addition, when the variation in device characteristics or the tolerance of the packaging process is serious, the impedance matching cannot be achieved within a desired range so that the fabricated optical module cannot be used. In addition, since the conventional optical module uses stubs to match the impedance, an operating frequency band is difficult to be adjusted. Also, due to a narrow bandwidth characteristic of the stub, the conventional optical module is difficult to be applied to a system requiring a wide bandwidth.

Meanwhile, the conventional optical module is formed such that a bias voltage for driving the optical device is supplied through the signal line 12. Therefore, a bias tee should be additionally installed such that the bias voltage is inputted from the external circuit 20, thereby increasing the size of the optical module. The bias tee comprises a capacitor and an inductor connected in parallel to each other, and thus the RF signal inputted from the external circuit 20 is delivered to the optical device 13 through the capacitor. However, the bias voltage supplied through the inductor cannot be applied to other external circuit 20 due to the capacitor, and the RF signal inputted from the external circuit 20 cannot affect the bias voltage due to the inductor.

FIG. 3 is a graph showing a return loss of the conventional optical module. Line B denotes a return loss measured before trimming the open stubs 15, and line C denotes a return loss measured after trimming the open stubs 15. As shown in FIG. 3, it can be seen that the impedance was matched at a frequency band of 60 GHz and that the impedance could be matched only in a narrow band due to the characteristic of the open stubs 15.

SUMMARY OF THE INVENTION

The present invention is directed to an optical module that facilitates impedance matching between an external circuit and an optical device and thus allows an RF signal inputted from the external circuit to be delivered to the optical device without any loss.

The present invention is also directed to an optical module that can be applied to a wide frequency band and fabricated in a small size.

One aspect of the present invention is to provide an optical module including: an optical device; a signal line for delivering a radio frequency (RF) signal inputted from an external circuit to the optical device; and a resistor separately disposed from the signal line and having one end connected with the optical device, wherein an input impedance seen from the signal line is matched by the resistor.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

In order to fabricate an optical module required for radio over fiber (ROF) technology that delivers a radio frequency (RF) signal through an optical fiber, a packaging technique that can deliver the RF signal to a high-speed optical device such as a laser diode, an optical modulator, and an optical receiver without any loss is needed. The present invention provides an optical module for a high-speed optical device, e.g., a laser diode, an optical modulator, and an optical receiver that is used in a communication system employing the ROF technology.

Figure 1:
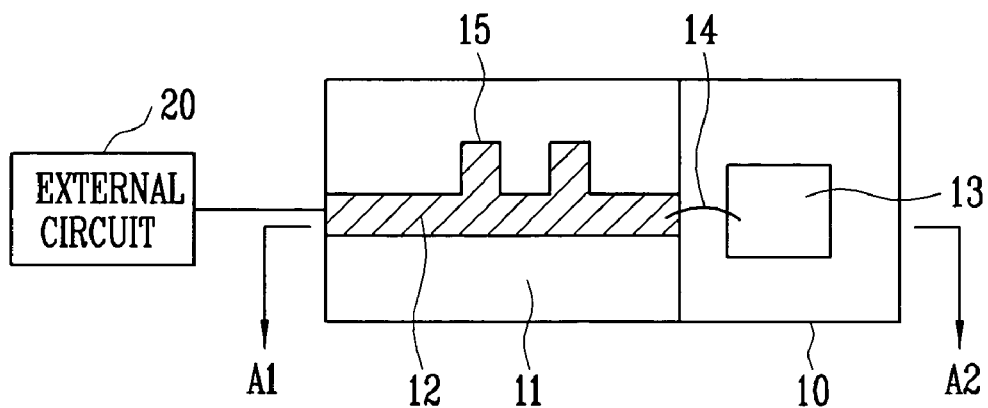
FIG. 1 is a plan view of a conventional optical module.
Figure 2:
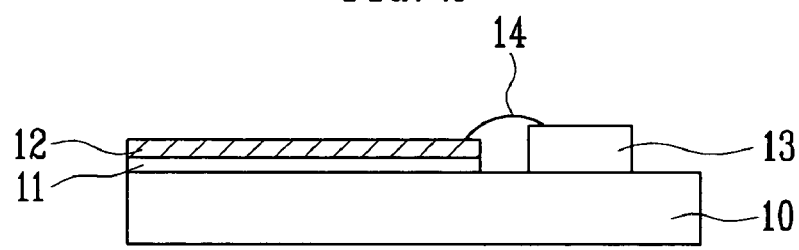
FIG. 2 is a cross-sectional view taken along line A1-A2 of FIG. 1.
Figure 3:
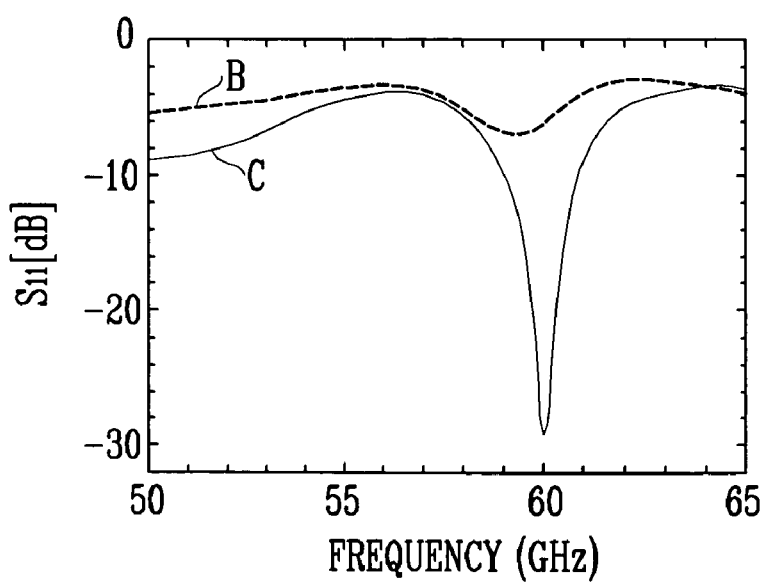
FIG. 3 is a graph showing a return loss of the conventional optical module.
Figure 4:
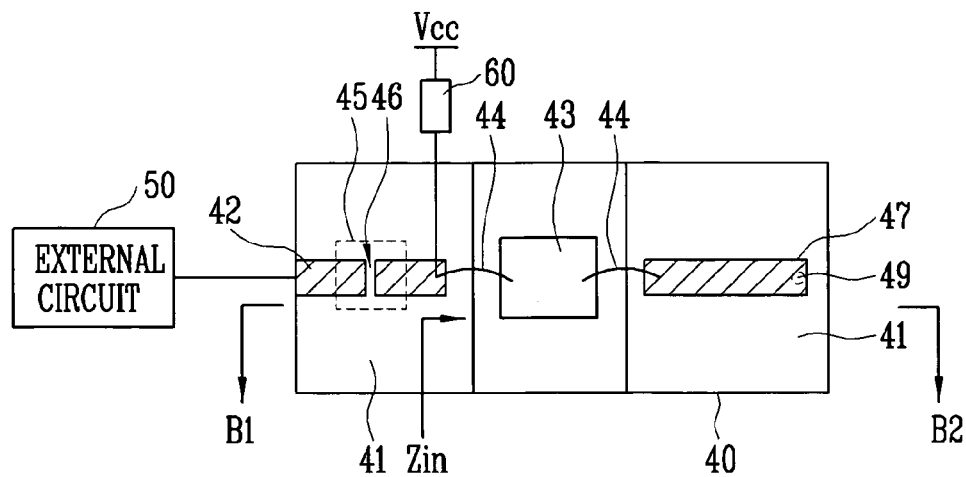
FIG. 4 is a plan view of an optical module according to a first embodiment of the present invention.
Figure 5:
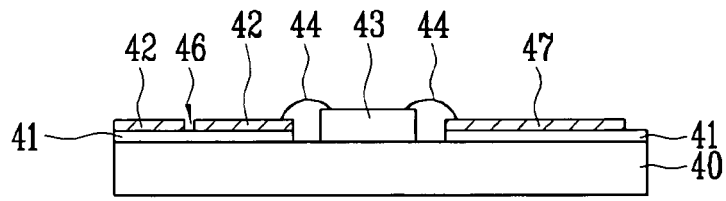
FIG. 5 is a cross-sectional view taken along line B1-B2 of FIG. 4.

FIG. 4 is a plan view of an optical module according to a first embodiment of the present invention, and FIG. 5 is a cross-sectional view taken along line B1-B2 of FIG. 4.

An optical device 43 is mounted on a substrate 40 that serves as a ground. The ground is made of a metal substrate 40 that can effectively dissipate heat generated from the optical device 43 and has an excellent heat radiation characteristic, and a surface of the substrate 40 may be plated with a metal film such as gold to increase electrical conductivity. A dielectric having excellent thermal conductivity may be inserted between the substrate 40 and the optical device 43, and the ground of the optical device 43 may be connected to the metal substrate 40 through a via hole of the dielectric for providing stable ground.

On one side of the substrate 40 adjacent to the optical device 43, a signal line 42 is formed to deliver an RF signal input from an external circuit 50 to the optical device 43. The signal line 42 is made of a microstrip line, and electrically insulated from the substrate 40 by a dielectric 41. In addition, a filter 45 is formed at a predetermined point of the signal line 42 so that the RF signal is transported and a direct current (DC) voltage is blocked. The filter 45 can be formed by a pattern of the signal line 42 without an additional process, and thus include, for example, at least one disconnection (slot) 46 formed at the predetermined point of the signal line 42 of a thin film. In other words, a slot is formed in the pattern of the signal line 42 at a predetermined interval, which physically disconnects the signal line 42 and is electrically coupled by parasitic capacitance. When the signal line 42 and the filter 45 are designed to be simultaneously formed, it is possible to reduce a manufacturing cost and a possibility that electrical loss is caused by discontinuity between the signal line 42 and the filter 45.

On the other side of the substrate 40 adjacent to the optical device 43, a resistor 47 for impedance matching is formed. The resistor 47 may be formed of a line (strip line) RF resistor that is made of a metal such as TaN or a semiconductor material, and is electrically insulated from the substrate 40 by the dielectric 41. In addition, the resistor 47 can be connected to the ground through a via hole 49 formed in the dielectric 41 to be used as a termination resistor. As shown in FIG. 4, the resistor 47 is separately formed from the signal line 42 and has at least one end connected to an electrode of the optical device 43 by a wire. In addition, even though an embodiment does not have the via hole, the resistor 47 can be connected to the ground by parasitic capacitance between the thin film resistor 47 and the substrate 40.

A pad of the signal line 42 and an electrode of the optical device 43, and the electrode of the optical device 43 and the resistor 47 are connected by wires or ribbon wires 44 made of gold (Au) and so forth. In addition, a DC bias voltage as a power source for driving the optical device 43 is applied to the signal line 42 from a voltage source Vcc through an inductor 60 and a power supply line.

Figure 6:
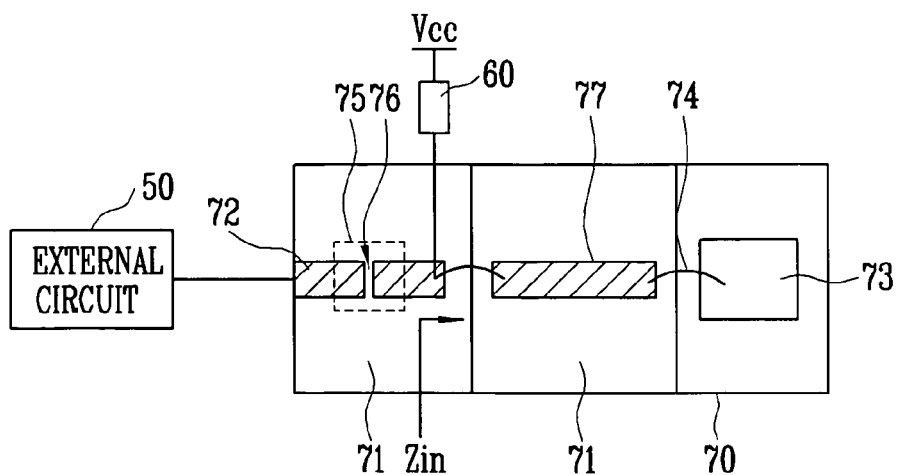
FIGS. 6 and 7 are plan views of optical modules according to second and third embodiments of the present invention, respectively.

FIG. 6 is a plan view of an optical module according to a second embodiment of the present invention. While the first embodiment shown in FIG. 4 has the structure of the external circuit 50, the signal line 42, the optical device 43, and the resistor 47 which are connected in series in the order, the second embodiment has a structure of an external circuit 50, a signal line 72, a resistor 77, and an optical device 73 which are connected in series in the order as shown in FIG. 6. Specifically, the resistor 77 is connected between the signal line 72 and the optical device 73, and an RF signal inputted through the signal line 72 passes through the resistor 77 and then is supplied to the optical device 73. The optical module according to the second embodiment has a minute difference only in a characteristic curve shape and is almost the same as the first embodiment so that description thereof will be omitted.

Figure 7:
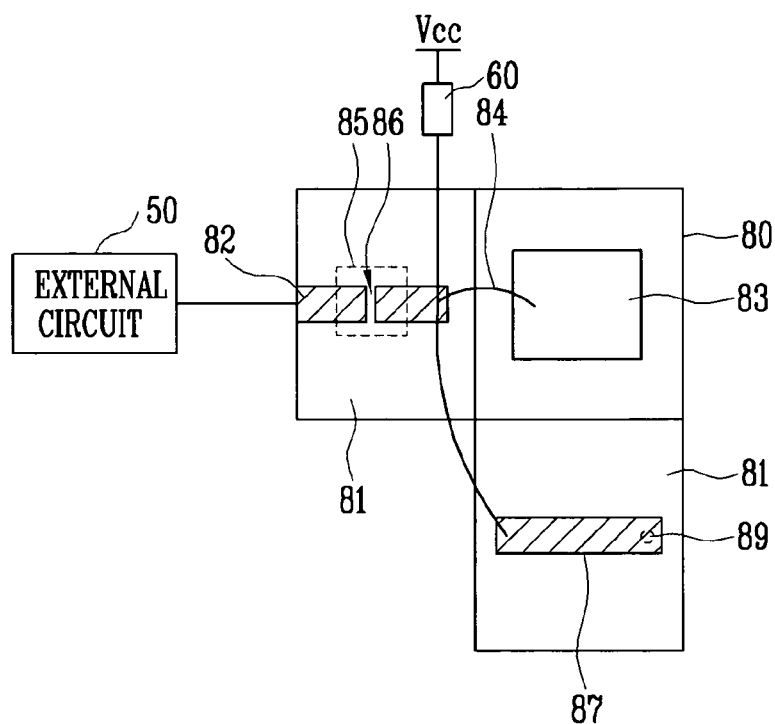

FIG. 7 is a plan view of an optical module according to a third embodiment of the present invention. In the optical module, an external circuit 50, a signal line 82, and an optical device 83 are connected in series, and a resistor 87 is connected in parallel with the optical device 83. In the third embodiment, an external power supply wire, a wire 84 between the optical device 83 and the signal line 82, and a wire for connecting to the resistor 87 are connected at one point of an output terminal of the signal line 82. In other words, one end of the resistor 87 is connected to the optical device 83 through the wire 84 between the signal line 82 and the optical device 83. The optical module according to the third embodiment also has a minute difference in a characteristic curve shape and is almost the same as the first embodiment so that description thereof will be omitted.

In the optical module formed as described above, the resistance of the resistor 87 is preferably determined such that the input impedance Zin seen from the signal line 82 to the optical device 83 becomes about 50Ω. For example, termination resistance may be designed to be between 50 and 1000Ω, and preferably, about 500Ω.

When the resistance is determined as described above, the input impedance from the signal line 42 to the optical device 43 becomes about 50Ω and thus the filter 45 formed in the signal line 42 exhibits excellent characteristics. In other words, characteristics of a pass band and a stop band of the filter 45 can be achievable as it is on the signal line 42 in the optical module, so that an additional tuning process, e.g., laser trimming, for impedance matching is not required. Since the filter 45 shows a wide bandwidth characteristic of 2 to 3 GHz in frequency range according to the design, the optical module can satisfy a desired bandwidth characteristic. In addition, since characteristics of the filter are not changed as much as a stub by variation of device characteristics, termination resistance, or a tolerance of a packaging process, the filter can have a uniform wideband characteristic. Therefore, it is possible to easily adjust a bandwidth and fabricate an optical module, and reduce a defect rate in the fabrication process.

Figure 8:
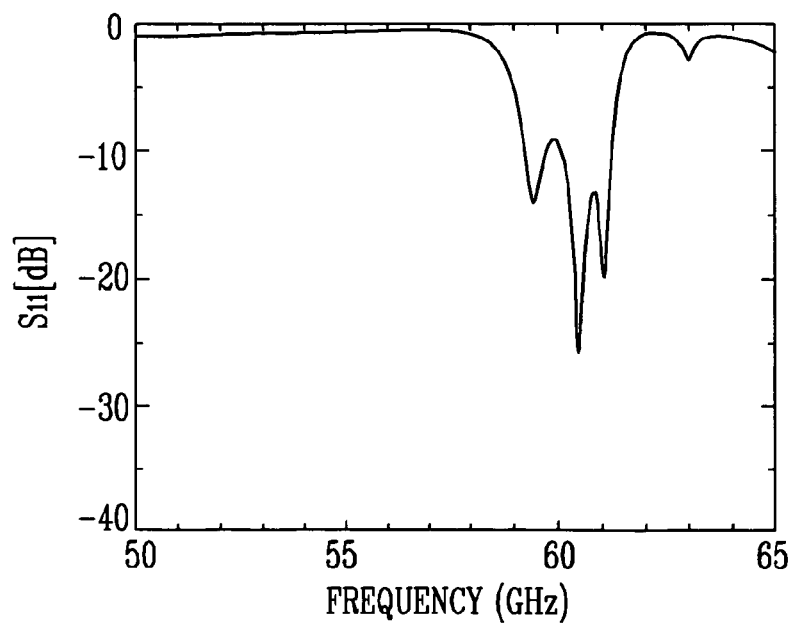
FIG. 8 is a graph showing a return loss of an optical module according to the present invention.

FIG. 8 is a graph showing a return loss at 60 GHz of an optical module according to the present invention. FIG. 8, shows about 3 GHz bandwidth of $S_{11}$ of less than −10 dB. It can be concluded that impedance is matched in a wider bandwidth than the conventional optical module.

Meanwhile, in the optical module of the present invention, a DC bias voltage is supplied to the optical device 43 through the inductor 60. Therefore, an RF signal transported to the optical device 43 through the signal line 42 cannot affect the bias voltage due to the inductor 60, and the bias voltage that is supplied to the optical device 43 through the inductor 60 cannot affect the external circuit 50 due to the filter 45. Specifically, the filter 45 serves as a capacitor, so that the RF signal passes through the filter 45 but DC current cannot flow through the filter 45. In addition, the inductor 60 acts as a resistor against the RF signal, so that the RF signal cannot pass through it. Since the filter 45 and the inductor 60 constitute a bias tee, an additional bias tee is not required, so that the size of the optical module can be reduced.

Figure 9:
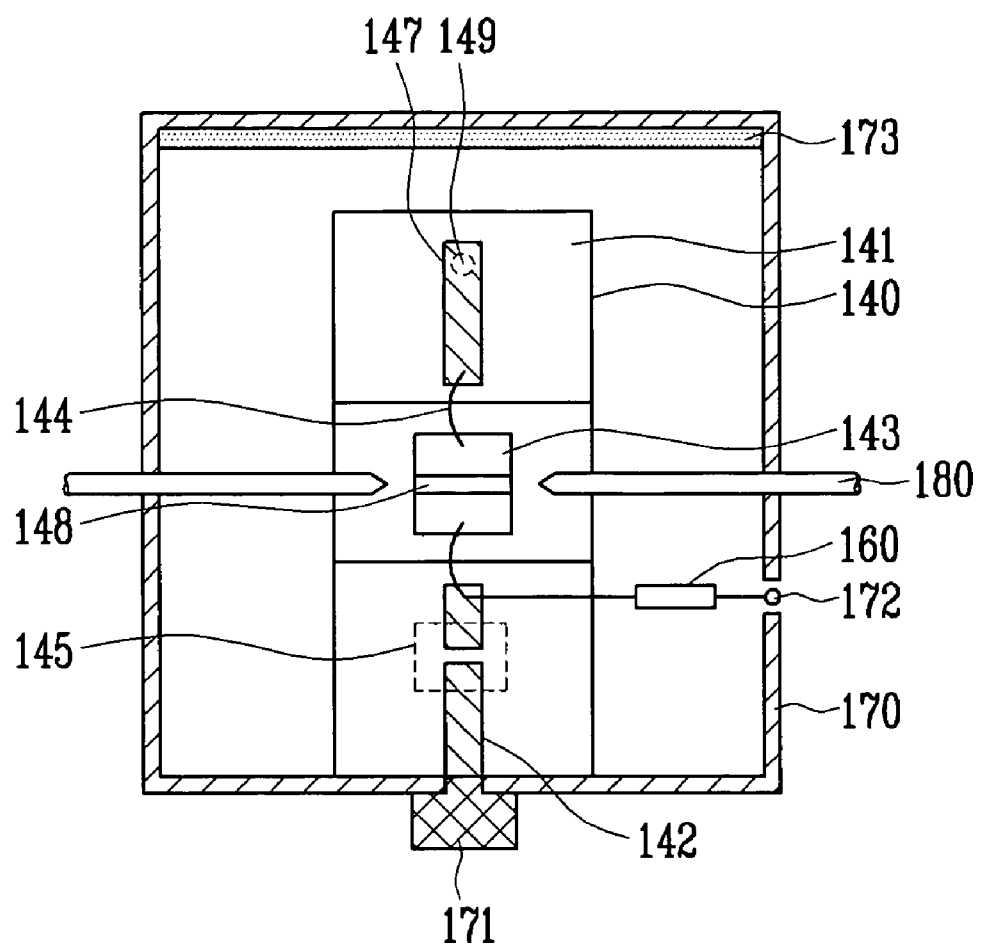
FIG. 9 is a plan view illustrating an example of a housing mounting an optical module of the present invention.

FIG. 9 is a plan view illustrating an example of a housing in which an optical module of the present invention is mounted, and more specifically, an optical module package in which an optical modulator with a waveguide 148 is mounted.

The optical module package shown in FIG. 9 comprises: an optical device 143; a signal line 142 for delivering an RF signal to the optical device 143; a bias tee that separates the RF signal and DC power for the optical device 143; a housing 170 for providing the hermeticity to the optical device 143, the termination resistor 149, and the bias tee; an RF connector 171 receiving the RF signal from the exterior of the housing and connected to the signal line 142; and a power input terminal 172 receiving DC power from the exterior of the housing and connected to the signal line 142. The DC power supplied through the power input terminal 172 and the RF signal inputted through the RF connector 171 pass through the bias tee and are supplied to the optical device 143. The bias tee may include a capacitance filter 145 formed of a slot in a pattern of the signal line 142, and an inductor 160 connected to the power input terminal 172 and allowing the driving DC power for the optical device 143.

The optical module package shown in FIG. 9 includes a resistor for impedance matching that has the same structure as the resistor shown in FIG. 4, and optical fibers 180 to deliver the continuous light to the optical device 148 and to receive the modulated wave from the optical device 148. Electrodes of the optical device 143 are disposed at both sides of the waveguide 148 in the optical device 143, and a wire for connecting with the resistor 147 and another wire for connecting with the signal line 142 may be coupled to the both electrodes of the waveguide 148. In this case, the wires can be connected to one electrode, or different electrodes from each other.

The optical module of the present invention is mounted in the housing 170 made of a metal and so forth. The signal line 142 of the optical module is connected to the RF connector 171 mounted in the housing 170, and the inductor 160 is connected to the power input terminal 172 of the housing 170. The RF connector 171 is connected to an external circuit (not shown), and the power input terminal 172 is connected to a power supply Vcc (not shown). According to a requirement of a system, a microstrip line or coplanar waveguide can be used instead of the RF connector 171, so that the module can be more easily mounted.

A hole is formed to fit to the waveguide 148 of the optical device 143 on a sidewall of the housing 170. The optical fiber 180 is inserted through the hole and aligned with the waveguide 148. A tapered fiber or lensed fiber can be used for the optical fiber 180. While FIG. 9 illustrates a structure having the optical fiber 180 optically aligned in both directions of the waveguide 148, it is possible to realize a structure having the optical fiber 180 optically aligned in one direction of the waveguide 148.

In the state that a bias voltage is supplied to the optical device 143 from the power supply Vcc (not shown) through the inductor 160, the RF signal is transported from the external circuit (not shown) through the RF connector 171. Here, when the RF signal is weak, an amplifier can be mounted in the optical module to amplify the RF signal. When the amplifier is mounted between the external circuit (not shown) and the signal line 142, impedance matching between the amplifier and the optical device 143 is performed by the filter 145, so that an additional process or means for the impedance matching is not required.

The RF signal provided through the RF connector 171 is delivered to the optical device 143 through the signal line 142. A laser received from one optical fiber 180 is modulated by the RF signal at the optical device 143, and the modulated optical signal is transmitted to another optical fiber 180 through the waveguide 148.

Meanwhile, as another embodiment of the present invention, a thermistor that senses the temperature of the optical device 143 and a thermoelectric cooler for uniformly maintaining the temperature can be mounted in the housing 170, and an RF absorber 173 can be mounted on an inner wall of the housing 170 to prevent RF resonance due to the housing 170.

As described above, the optical modules of the present invention allow an RF signal inputted from an external circuit to be delivered to an optical device without any loss in a communication system that employs the ROF technology delivering the RF signal through an optical fiber.

Since resistance is designed such that input impedance seen from a signal line at the front stage of a filter becomes about 50Ω, impedance is easily matched even though device characteristics vary or a process error occurs. In addition, since impedance matching is guaranteed in a wide bandwidth of 2 to 3 GHz, a wide bandwidth RF signal can be delivered to an optical device without loss. Therefore, it is possible to maximize a gain, reduce a noise figure, and secure a large number of channels.

In addition, since an RF signal and a bias voltage do not interfere each other due to a filter formed in a signal line and an inductor connected with the signal line, an additional bias tee is not required. Therefore, a small-sized optical module can be fabricated.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An optical module comprising:
   an optical device mounted on a metal substrate;
   a signal line disposed on the substrate and electrically insulated from the substrate by a dielectric, said optical device and signal line electrically coupled to each other for delivering a radio frequency (RF) signal inputted from an external circuit to the optical device;
   a resistor separately disposed from the signal line and having one end connected with the optical device, said resistor disposed on the substrate and electrically insulated from the substrate by a dielectric; and a filter formed by a pattern of the signal line, the filter including a disconnection slot between a rear end of a first portion of the signal line and a front end of a second portion of the signal line, wherein an input impedance seen from the signal line is matched by the resistor and the RF signal continues past the disconnection slot and direct current (DC) is blocked by the disconnection slot.

2. The optical module according to claim 1, wherein the filter cuts off the signal line at a predetermined interval.

3. The optical module according to claim 1, further comprising an inductor for preventing the RF signal from being delivered to an external power source that supplies driving power to the optical device.

4. The optical module according to claim 1, wherein the resistor has a microstrip line shape.

5. The optical module according to claims 1, 2, 3 or 4, wherein the other end of the resistor is connected to a ground.

6. The optical module according to claims 1, 2, 3 or 4, wherein the resistor is connected between the signal line and the optical device.

7. The optical module according to claims 1, 2, 3 or 4, wherein the one end of the resistor is connected to the optical device through a power feeding wire between the signal line and the optical device.

8. An optical module comprising:
an optical device mounted on a metal substrate;
a signal line disposed on the substrate and electrically insulated from the substrate by a dielectric, said optical device and signal line electrically coupled to each other for delivering a radio frequency (RF) signal input from an external circuit to the optical device; and
a filter formed by a pattern of the signal line, the filter including a disconnection slot between a rear end of a first portion of the signal line and a front end of a second portion of the signal line,
wherein the RF signal continues past the disconnection slot and direct current (DC) is blocked by the disconnection slot.

9. The optical module according to claim 8, wherein the filter passes the RF signal and blocks a direct current (DC) component.

10. The optical module according to claim 8, wherein the disconnection slot cuts off the signal line at a predetermined interval.

11. The optical module according to claim 8, wherein the filter and the optical device are connected by a power supply line for supplying driving power to the optical device.

12. The optical module according to claim 11, wherein the power supply line is connected to an inductor for preventing the RF signal from being delivered to the external.

13. The optical module according to claim 8, wherein the signal line has a strip line shape.

14. An optical module package comprising:
an optical device mounted on a metal substrate;
a signal line disposed on the substrate and electrically insulated from the substrate by a dielectric, said optical device and signal line electrically coupled to each other for delivering a radio frequency (RF) signal to the optical device;
a bias tee for separating the RF signal and a direct current (DC) power supply for the optical device;
a housing for protecting the optical device, the signal line, and the bias tee;
an RF connector receiving the RF signal from the exterior of the housing and connected with the signal line;
a power input terminal receiving a DC power supply from the exterior of the housing and connected with the signal line, and
a filter formed by a pattern of the signal line, the filter including a disconnection slot between a rear end of a first portion of the signal line and a front end of a second portion of the signal line
wherein the RF signal continues past the disconnection slot and direct current (DC) is blocked by the disconnection slot.

15. The optical module package according to claim 14, further comprising a resistor separately disposed from the signal line to match input impedance seen from the signal line, and having one end connected to the optical device.

16. The optical module package according to claim 14, wherein the bias tee includes a slot cutting off the signal line at a predetermined interval.

17. The optical module package according to claim 14, wherein the bias tee includes an inductor connected between the signal line and the power input terminal.

* * * * *